(12) United States Patent
Venkatesan et al.

(10) Patent No.: US 11,755,603 B1
(45) Date of Patent: Sep. 12, 2023

(54) SEARCHING COMPRESSION PROFILES FOR TRAINED NEURAL NETWORKS

(71) Applicant: Amazon Technologies, Inc., Seattle, WA (US)

(72) Inventors: Ragav Venkatesan, Seattle, WA (US); Gurumurthy Swaminathan, Redmond, WA (US); Xiong Zhou, Bothell, WA (US); Runfei Luo, Kirkland, WA (US); Vineet Khare, Redmond, WA (US)

(73) Assignee: Amazon Technologies, Inc., Seattle, WA (US)

( * ) Notice: Subject to any disclaimer, the term of this patent is extended or adjusted under 35 U.S.C. 154(b) by 590 days.

(21) Appl. No.: 16/831,584

(22) Filed: Mar. 26, 2020

(51) Int. Cl.
| | |
|---|---|
| *G06F 16/24* | (2019.01) |
| *G06F 16/2458* | (2019.01) |
| *G06F 16/25* | (2019.01) |
| *G06F 16/248* | (2019.01) |
| *G06N 3/04* | (2023.01) |
| *H03M 7/30* | (2006.01) |
| *G06N 3/082* | (2023.01) |
| *G06Q 10/10* | (2023.01) |

(52) U.S. Cl.
CPC ......... *G06F 16/2474* (2019.01); *G06F 16/248* (2019.01); *G06F 16/252* (2019.01); *G06N 3/04* (2013.01); *G06N 3/082* (2013.01); *H03M 7/30* (2013.01); *G06Q 10/10* (2013.01)

(58) Field of Classification Search
CPC .... G06F 16/2474; G06F 16/248; G06F 16/252
See application file for complete search history.

(56) References Cited

U.S. PATENT DOCUMENTS

2015/0347585 A1 12/2015 Klotz
2019/0251422 A1 8/2019 Ramanath et al.
(Continued)

OTHER PUBLICATIONS

Kaiming He, et al., "Deep Residual Learning for Image Recognition", in Proceedings of the IEEE conference on computer vision and pattern recognition, 2016, Pages 770-778.
Aidan N. Gomez, et al., "Learning Sparse Networks Using Targeted Dropout", arXiv"1905.13678v5, Sep. 9, 2019, Pages 1-14.
Amir H. Ashouri, et al., "Fast On-the-fly Retraining-free Sparsification of Convolutional Neural Networks", arXiv:181.04199v3, Sep. 8, 2019, Pages 1-8.
(Continued)

*Primary Examiner* — Loc Tran
(74) *Attorney, Agent, or Firm* — S. Scott Foster; Kowert, Hood, Munyon, Rankin & Goetzel, P.C.

(57) ABSTRACT

Compression profiles may be searched for trained neural networks. An iterative compression profile search may be performed response to a search request. Different prospective compression profiles may be generated for trained neural networks according to a search policy. Performance of compressed versions of the trained neural networks according to the compression profiles may be tracked. The search policy may be updated according to an evaluation of the performance of the compression profiles for the compressed versions of the trained neural networks using compression performance criteria. When a search criteria is satisfied, a result for the compression profile search may be provided.

20 Claims, 10 Drawing Sheets

(56) References Cited

U.S. PATENT DOCUMENTS

| | | | |
|---|---|---|---|
| 2019/0392300 A1* | 12/2019 | Weber et al. | G06N 3/04 |
| 2020/0026556 A1 | 1/2020 | Chitlur et al. | |
| 2020/0372621 A1 | 11/2020 | Naruniec et al. | |
| 2020/0410336 A1* | 12/2020 | Choudhury et al. | G06N 3/082 |
| 2021/0027470 A1 | 1/2021 | Lin et al. | |
| 2021/0335017 A1 | 10/2021 | Covell et al. | |

OTHER PUBLICATIONS

Anthony Robins, "Catastrophic Forgetting, Rehearsal, and Pseudorehearsal", Connection Science, 7(2), 1995, Pages 123-146.

Anubhav Ashok, et al., "N2N Learnig: Network to Network Compression via Policy Gradient Reinforcement Learning", arXiv:1709.06030v2, Dec. 17, 2017, Pages 1-20.

Aravind Rajeswaran, et al., "Learning Complex Dexterous Manipulation with Deep Reinforcement Learning and Demostrations", arXiv:1709.10087v2, Jun. 26, 2018, Pages 1-9.

Ari S. Morcos, et al., "OneTicket to win them all: generalizing lottery ticket initializations across datasets and optimizers", arXiv:1906.02773v2, Oct. 27, 2019, Pages 1-13.

Barret Zoph, et al., "Neural Architecture Search with Reinforcement Learning", arXiv:1611.01578v2, Feb. 15, 2017, Pages 1-16.

Christopher Berner, et al., "Dota 2 with Large Scale Deep Reinforcement Learning", arXiv:1912.06680v1, Dec. 13, 2019, Pages 1-66.

Christos Louizos, et al., "Learning Sparse Neural Networks through L0 Regularization", arXiv:1712.01312v2, Jun. 22, 2018, Pages 1-13.

David Silver, et al., "Mastering the game of Go with deep neural networks and tree search", Nature, Volume 529, Jan. 28, 2016, pages 484-503.

Deepak ittal, et al., "Recovering from Random Pruning: On the Plasticity of Deep Convolutional Neural Networks", arXiv-1801.10447v1, Jan. 31, 2018, Pages 1-10.

Dmitry Molchanov, et al., "Variational Dropout Sparsifies Deep Neural Networks", in Proceedings of the 34th International Conference on Machine Learning, PMLR 70, 2017, Pages 1-10.

Geoffrey Hinton, et al., "Distilling the Knowledge in a Neural Network", arXiv:1503.02531v1, Mar. 9, 2015, Pages 1-9.

Hao Zhou, et al., "Less is More: Towards Compact CNNs",. In European Conference on Computer Vision, Springer, 2016, Pages 662-677.

Hattie Zhou, et al., "Deconstructing Lottery Tickets: Zeros, Signs, and the Supermask", arXiv:1905.01607v4, Mar. 3, 2020, Pages 1-18.

Hengyuan Hu, et al., "Network Timing: A Data-Driven Neuron Pruning Approach towards Efficient Deep Architectures", arXiv:1607.03250v1, Jul. 12, 2016, Pages 1-9.

Ji Lin, et al., "Rutime Neural Pruning", in The 31st Conference on Neural Information Processing Systems (NIPS 2017), 2017 Pages 1-11.

Jiahui Yu, et al., "Universally Slimmable Networks and Improved Training Techniques", Proceedings of the IEEE/CVF International Conference on Computer Vision, 2019, Pages 1-9.

Jian-Hao Luo, et al., "ThiNet: A Filter Level Pruning Method for Deep Neural Network Compression", In The IEEE International Conference on Computer Vision (ICCV), Oct. 2017, Pages 5058-5066.

Jianbo Ye, et al., "Rethinking the Smaller-Norm-Less-Informative Assumption in Channel Pruning on Convolutional Layers", arXiv:1802.00124v2, Feb. 2, 2018, Pages 1-11.

John Schulman, et al., "Proximal Policy Optimization Algorithms", arXiv:1707.06347v2, Aug. 28, 2017, Pages 1-12.

Jonathan Frankle, et al., "The Lottery Ticket Hypothesis: Finding Sparse, Trainable Neural Networks", arXiv:1803.03635v5, Mar. 4, 2019, Pages 1-42.

Jose M. Alvarez, et al., "Learning the Number of Neurons in Deep Networks", arXiv:1611.06321v3, Oct. 11, 2018, Pages 1-9.

U.S. Appl. No. 16/831,595, filed Mar. 26, 2020, Gurumurthy Swaminathan, et al.

U.S. Appl. No. 16/836,376, filed Mar. 31, 2020, Gurumurthy Swaminathan, et al.

Marcin Andrychowicz, et al., "Learning dexterous in-hand manipulation", in The International Journal of Robotics Research 39 (1), 2020, Pages 1-18.

Michael H. Zhu, et al., "To prune, or not to prune: exploring the efficacy of pruning for model compression", arXiv:1710.01878v2, Nov. 13, 2017, Pages 1-11.

Pavlo Molchanov, et al., "Pruning Convolutional Neural Networks for Resource Efficient Inference", arXiv:1611.06440v2, Jun. 8, 2017, Pages 1-17.

Ragav Venkatesan, et al., "Diving deeper into mentee networks", arXiv:1604.08220v1, Apr. 27, 2016, Pages 1-9.

Ruichi Yu, et al., "NISP: Pruning Networks using Neuron Importance Score Propagation", In The IEEE Conference on Computer Vision and Pattern Recognition (CVPR), Jun. 2018, Pages 9194-9203.

Shashank Singh, et al., "DARC: Differentiable Architecture Compression", arXiv:1905.08170v1, May 20, 2019, Pages 1-19.

Song Han, et al., "Learning both Weights and Connections for Efficient Neural Networks", arXiv:1506.02626v3, Oct. 30, 2015, Pages 1-9.

Suraj Srinivas, et al, "Data-free Parameter Pruning for Deep Neural Networks", arXiv:1507.06149v1, Jul. 22, 2015, Pages 1-12.

Timothy P. Lillicrap, et al., "Continuous Control with Deep Reinforcement Learning", arXiv:1509.02971v6, Jul. 5, 2019, Pages 1-14.

Ting-Wu Chin, et al., "Layer-Compensated Pruning for Resource-Constrained Convolutional Neural Networks", arXiv:1810.00518v2, Oct. 18, 2018, Pages 1-12.

Vadim Lebedev, et al., "Fast ConvNets Using Group-wise Brain Damage", In Proceedings of the IEEE Conference on Computer Vision and Pattern Recognition, 2016, Pages 2554-2564.

Wei Wen, et al., "Leaning Structured Sparsity in Deep Neural Networks", arXiv:1608.03665v4, Oct. 18, 2016, Pages 1-10.

Xin Wang, et al., "SkipNet: Learning Dynamic Routing in Convolutional Networks", In The European Conference on Computer Vision (ECCV), Sep. 2018, Pages 1-16.

Yang He, et al., "Soft Filter Pruning for Accelerating Deep Convolutional Neural Networks", arXiv:1808.06866v1, Aug. 21, 2018, Pages 1-8.

Yann Le Cun, et al., "Optimal Brain Damage", In Advances in neural information processing systems, 1990, Pages 598-605.

Yihui He, et al., "AMC: AutoML for Model Compression and Acceleration on Mobile Devices", In The European Conference on Computer Vision (ECCV), Sep. 2018, Pages 1-17.

Yihui He, et al., "Channel Pruning for Accelerating Very Deep Neural Networks", In The IEEE International Conference on Computer Vision (ICCV), Oct. 2017, Pages 1-9.

Yuandong Tian, et al., "ELF: An Extensive, Lightweight and Flexible Research Platform for Real-time Strategy Games", arXiv:1707.01067v2, Nov. 10, 2017, Pages 1-14.

Zehao Huang, et al., "Data-Driven Sparse Structure Selection for Deep Neural Networks", In The European Conference on Computer Vision (ECCV), Sep. 2018, Pages 1-17.

Zhuang Liu, et al., "Learning Efficient Convolutional Networks through Network Slimming", In Proceedings of the IEEE International Conference on Computer Vision, 2017, Pages 2736-2744.

Zhuang Liu, et al., "Rethinking the Value of Network Pruning", arXiv:1810.05270v2, Mar. 5, 2019, Pages 1-21.

Zhuwei Qin, et al., "Demystifying Neural Network Filter Pruning", arXiv:1811.02639v1, Oct. 29, 2018, Pages 1-4.

\* cited by examiner

SEARCHING COMPRESSION PROFILES FOR TRAINED NEURAL NETWORKS

BACKGROUND

Neural networks are implemented in a wide variety of machine learning applications and offer solutions to perform tasks that are difficult for other types of machine learning techniques to perform. Convolutional neural networks, for example, are implemented across different types of recognition, recommendation, and classification systems. With the increasing numbers of problems being addressed with neural networks, the scale and complexity of neural networks to model the solutions for these problems is also increasing. To accommodate larger and more complex neural networks, increasing numbers of computational resources may need to be utilized which may stymie the application of neural networks in addressing new problems or providing solutions in different ways.

Figure 1:
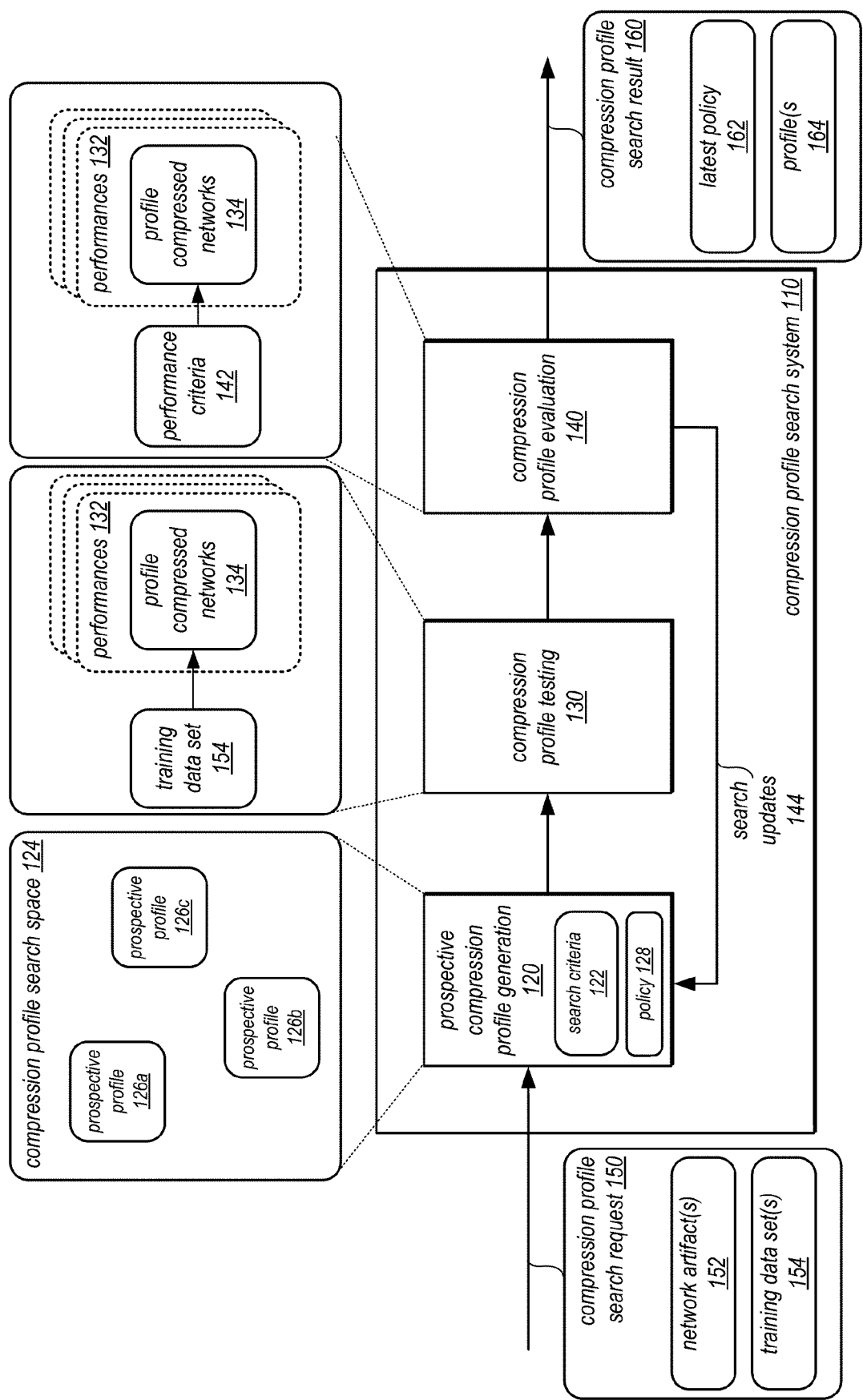
FIG. 1 illustrates a logical block diagram of searching compression profiles for trained neural networks, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as described by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the scope of the present invention. The first contact and the second contact are both contacts, but they are not the same contact.

DETAILED DESCRIPTION OF EMBODIMENTS

Various techniques of searching compression profiles for trained neural networks are described herein. In various embodiments, compression may be performed to reduce the size of a trained network or other machine learning model. Such compression may be applied to minimize a change in the accuracy of results provided by the neural network or other machine learning model. For example, as very large neural networks can become cost prohibitive to implement in systems with various processing limitations (e.g., memory, bandwidth, number of nodes, latency, processor capacity, etc.), techniques to provide compressed neural networks (e.g., layer, channel, or node pruning) can expand the possible implementations for a neural network (e.g., across different systems or devices with various resource limitations to implement the neural network). For example, compression may be implemented to lower the memory or power requirements for a neural network, or may be compressed to reduce latency be providing a faster result (e.g., a faster inference), in various embodiments, and/or may allow for systems of various computing capabilities (e.g., mobile devices, "smart" devices or other appliances, media players, televisions, etc.) in addition to more traditional systems (e.g., desktop computers, servers, distributed computing systems, etc.) to utilize the compressed neural network (or other machine learning model) to perform various tasks.

Determining how to compress a neural network or other machine learning model is also not without cost. Thus, the techniques described in various embodiments to research for compression profiles and compression policies to produce those compression profiles across similar network architectures may be implemented to decrease the cost (e.g., reduce time, making the compression faster) to apply compression. For example, channel pruning is one type of neural network compression that may be implemented in various embodiments, where the number of channels in each layer of a neural network is reduced. In some embodiments, a channel pruning algorithm may determine a number of channels to prune in each layer and which channels to prune in each layer. Instead of implementing iterative techniques that are time and resource intensive to determine the number and which channels to prune, fast network compression can be achieved from the application of predefined compression profiles that are specific to a network architecture (or similar network architectures) to quickly make compression decisions, such as how much to prune in each layer of a neural network, in various embodiments. Since the compression profiles may be applicable to any trained network of the same architecture, using these profiles can provide a high accuracy for the corresponding compression without utilize expensive and iterative analysis and instead provide a single-pass technique to compress a neural network. Moreover, using compression profiles in this way can reduce time taken for compression, as analysis may not be needed on the trained neural network.

In various embodiments, randomization can be used to select the features to remove, such as random pruning of channels from a neural network, as random pruning may works as well as any metric-based pruning. Moreover, since random pruning can be applied to the network without the analysis of the network features (as noted above) such as the weights, gradients, etc., and can be applied in a single-pass without iteration, further improvements to the speed of neural network compression can be accomplished. The deployment of compression techniques may also be simplified as a compression system may not need to compute complicated metrics (such as gradient, etc.) from the neural network. In other embodiments, other techniques can be utilized to select which features to remove, such as max-metric, learned, or online techniques.

Techniques for searching compression profiles may be performed to determine compression profiles that can be applied, as described above, in order to optimize various performance criteria for systems that implement the machine learning models compressed by the compression profiles. For example, to reduce memory utilization for an application that utilizes a machine learning model, a search for a compression profile (and/or policy to produce the compression profile) that minimizes memory utilization in compressed form (e.g., by removing features that reduce the amount of data stored or used to evaluate the compressed machine learning model) may be performed. Searches can be performed using various search techniques to update a compression policy used to produce the compression profiles evaluated with respect to the performance criteria. In this way, reusable, compression profiles (and compression policies) can be determined and applied to machine learning models without searching for a compression profile specific to that machine learning model. Instead, the previously found compression profile(s) and compression polic(ies) may be used to compress the machine learning model.

FIG. 1 illustrates a logical block diagram of searching compression profiles for trained neural networks, according to some embodiments. Compression profile search system 110 may handle requests, such as request 150, to search prospective compression profiles for one (or multiple) trained models and data sets in order to identify and provide a compression policy and/or compression profiles, such as result 160. Compression profile search system 110 may be implemented as a stand alone system or application, as a service (e.g., offered by a provider network like provider network 200 in FIG. 2), as part of another system or service (e.g., as part of machine learning service 210 in FIG. 2), or various other systems or devices that may compress (and possibly utilize) compressed machine learning models.

A compression profile may be, in various embodiments, information to determine the number and/or location of features to remove from a machine learning model (e.g., a trained neural network architecture) to reduce or otherwise compress that machine learning model. For example, a compression profile may be produced from a compression policy that is trained for compressing the same or similar neural network architectures. Such a compression profile may identify which channels to prune, how many nodes in a channel, and which particular nodes within the channel to prune, which may provide for quick, single-pass compression for neural networks with the same or similar architecture.

A compression policy may be, in various embodiments, may provide instructions, directions, or other strategies for generating (e.g., automatically) compression profiles for machine learning models. For example, for compression profiles that prune neural networks, a compression policy (e.g., a pruning policy) may indicate, among other features for generating a compression profile a technique to determine where and how much to prune for networks and/or layers using heuristics, learned features, or online techniques. For instance, a compression policy can specify or determine how much to prune can be taken at either a network-level or at a layer-level. While network-level decisions can be made once for every network, layer-level decisions may be made once every layer according to the policy. Since making layer-level decisions may implicitly make a network-level decision, often network-level decisions may be made first and propagated to layer-level. In some embodiments, a network-level compression policy may not propagate down to layer-level and may ignores the layer of the channel by treating all channels equally. Several types of compression policies can be used to decide how much to prune by pruning profile generator 322. These can range from heuristics such as a uniform compression policy across all layers, to learning a compression policy either online or offline, either using an reinforcement learning (RL) as discussed below with regard to FIGS. 6 - 8, or gradient-based methods, on observing some properties of the network or layer, depending on the level such as the correlation analysis of layers. For heuristic approaches, the heuristics may be designed in accordance to constraints based on the target of the compressed model. In iterative pruning techniques, the heuristics may also progressively be reduced. In some embodiments, a policy agent may be implemented to determine how much to prune layer-wise online.

In various embodiments, compression policies may be applied to generate compression profiles, which in turn indicate which features, such as which channel, to prune in the compression profile, in some embodiments, as indicated. A compression policy may provide information to determine which channels, for instance, are to be removed. In some embodiments, not all compression policies for deciding which features (e.g., channels) to remove be contingent on an a priori compression policy for how much to prune. Rather, a direct compression policy for which channels to prune could implicitly decide how much to prune as well, in some embodiments. In some embodiments, the importance of channels can be weighted before deciding which to channel prune. Some compression policies may provide profiles that completely freeze pruned layers or remove them altogether, while other compression policies may allow soft pruning at prune-time allowing parameters to recover back if they are needed, in some embodiments. Typical options specified by or found when searching for and/or training a compression policy may include which channels to prune contingent on a previously made decision for how much to prune, involving random decisions such as sampling from a Bernoulli distribution or using metrics of the layer's features (e.g., tensors), such as pruning the channels with the least expected L1 of weights, in some embodiments. Use of L1 of channels to select which channels to prune may be implemented, in some embodiments. Techniques that utilize metrics in the above fashion may sometimes be referred to as "max-metric".

Compression profile search system 110 may implement an interface, such as programmatic interface (e.g., using one or more Application Programming Interfaces), command line interface and/or graphical user interface (GUI) to handle requests and provide responses. For example, compression profile search request 150 may be received at compression profile search system 110 via an interface of compression profile search system 110.

Compression profile search request 150 may specify or include various features to perform the compression profile search, in some embodiments. For example, a compression profile search request 150 may receive one or more network artifacts 152 and corresponding training data set(s) 154 for network artifacts 152. Network artifacts may be trained machine learning models (e.g., neural networks) that are specified according to various formats, parameters, and/or data structures, which may include the architecture of the trained machine learning model and the weights, features, or other parameters of the trained machine learning model, in some embodiments. Training data set(s) 154 may be data sets used to train the network artifact(s) 152. In some embodiments, the request 150 may include pointers, paths, or other identifiers that allow compression profile search system 110 to obtain network artifact(s) 152 and/or training data sets 154, such as accessing a separate storage system to retrieve the network artifact(s) and training data set(s) 154.

In some embodiments, compression profile search system 110 may implement prospective compression profile generation 120, in some embodiments. Prospective compression profile generation 120 may apply a compression policy 126 in order to generation prospective compression profiles, such as prospective compression profiles 126*a*, 126*b*, and 126*c*, in compression profile search space 124, in various embodiments. For example, compression profile search space 124 may represent the various possible values of features of a compression profile that may be determined by prospective compression profile generation 120. As discussed earlier, policy 126 may specify information for generating the compression profiles. A search technique (e.g., a reinforcement learning technique, random search, or various other supported search techniques as discussed below) may be used to determine the various of the different prospective compression profiles 126 so that each prospective compression profile varies with respect to a value of one or more compression features. For example, prospective compression profiles 126 may specify the same nodes in the same channel to prune, but different nodes in another channel to prune (e.g., prospective compression profile 126*a* may differ in this way from prospective compression profile 126*b*).

Compression profile testing 130 may use the prospective compression profiles 126 to generate compressed networks, such as profile compressed networks 134, from the received network artifacts 152. For instance, compression profile testing 130 may prune the various nodes within specified layers of network artifacts 152 as directed by a compression profile, creating different versions for each artifact and compression profile combination, in some embodiments, as profile compressed networks 134. Compression profile testing 130 may direct and/or perform the profile compressed networks 134. For example, training data sets 154 may be used to train or otherwise utilize profile compressed networks 134 in order to collect, track, or record information describing the performances 132 of the profile compressed networks.

Performance information for performances 132 may include various metrics or other features descriptive of the use and/or implementation of profile compressed networks, in some embodiments. For example, metrics may describe resource utilization (e.g., memory, network bandwidth, processor utilization, I/O bandwidth, etc.), time to perform an inference or otherwise apply the profile compressed network 134, other aspects of the implementing the profile compressed network.

In various embodiments, compression profile evaluation 140 may be implemented as part of compression profile search system 110 in order to evaluate performances 132 of compressed profile networks 134 with respect to performance criteria 142. As discussed above, performance criteria 142 may be used to tailor the compression policy and thus compression profiles generated to compress a machine learning model to optimize one or multiple features of the model's performance. Memory optimization, network optimization, time or latency optimization, are various optimizations of model performance, among others, that alone or in combination may be optimized by evaluating the performances 132. Compression profile evaluation 140 may identify changes to a search policy that, for instance, increase desired performance or lessen/mitigate undesired performance in some embodiments. For example, updates to a policies specified number of channels, ranges of allowed nodes to remove, or various other policy features that can be adjusted may be done to correspond with the information gathered from the performance of the previous version of the compression policy used to generate the compression profiles used to generate the evaluated profile compressed networks 134. In this way, search techniques can be applied to refine or otherwise identify compression profiles and compression policies that achieve desired performance goals for a compressed machine learning model.

As discussed below with regard to FIGS. 4 - 6 and 8 - 9, generation of prospective compression profiles may be performed in iterative fashion in order to update the policy 126 to better achieve performance (as evaluated at 140), in some embodiments. Policy 128 being used to search by generating different prospective compression profiles may be updated, as indicated at 144, according to the evaluation of compressed performance networks with respect to the performance criteria. Search updates 144 may be applied to update policy 128. In this way, each iteration of compression profile search system 110 may allow for policy updates to be made in order to refine the policy 128 with respect to the goals measured by performance criteria 142. Iterative searching may continue until search criteria 122 is satisfied, in some embodiments. For example, search criteria 122 may be a time limit, resource limit, explicit request (e.g., from a client), or other criteria that triggers a halt to further iteration or searching. In some embodiments, such as the reinforcement learning techniques the search criteria may instead be specified as a training criteria to end iterative, reinforcement training for a compression policy.

Compression profile search system 110 may provide a compression profile search result 160, in various embodiments. The search result may be provided via the various interfaces discussed above. In some embodiments, the search result may include the latest policy 162 (from the iterations discussed above). In some embodiments, the result may include 164 the compression profiles 164 generated by the latest policy (or a subset of one more compression policies). Some results may include both policy 162 and profile(s) 164, where other results may include on or the other. What information is returned in result 160 may be specified in request 150, in some embodiments.

Please note that the previous description of is a logical illustration of searching compression profiles for trained neural networks and thus is not to be construed as limiting as to the compression system, neural network, compression type, or network tuning. For example, some features of compression profile search system 110 could be implemented separately by another system, such as compression profile testing 130 (e.g., a separate machine learning execution system, service or application could be utilized).

This specification begins with a general description of a provider network that implements multiple different services, including a machine learning service, which may perform searching compression profiles for trained neural networks. Then various examples of, including different components/modules, or arrangements of components/module that may be employed as part of implementing the machine learning service are discussed. A number of different methods and techniques to implement searching compression profiles for trained neural networks are then discussed, some of which are illustrated in accompanying flowcharts. Finally, a description of an example computing system upon which the various components, modules, systems, devices, and/or nodes may be implemented is provided. Various examples are provided throughout the specification.

Figure 2:
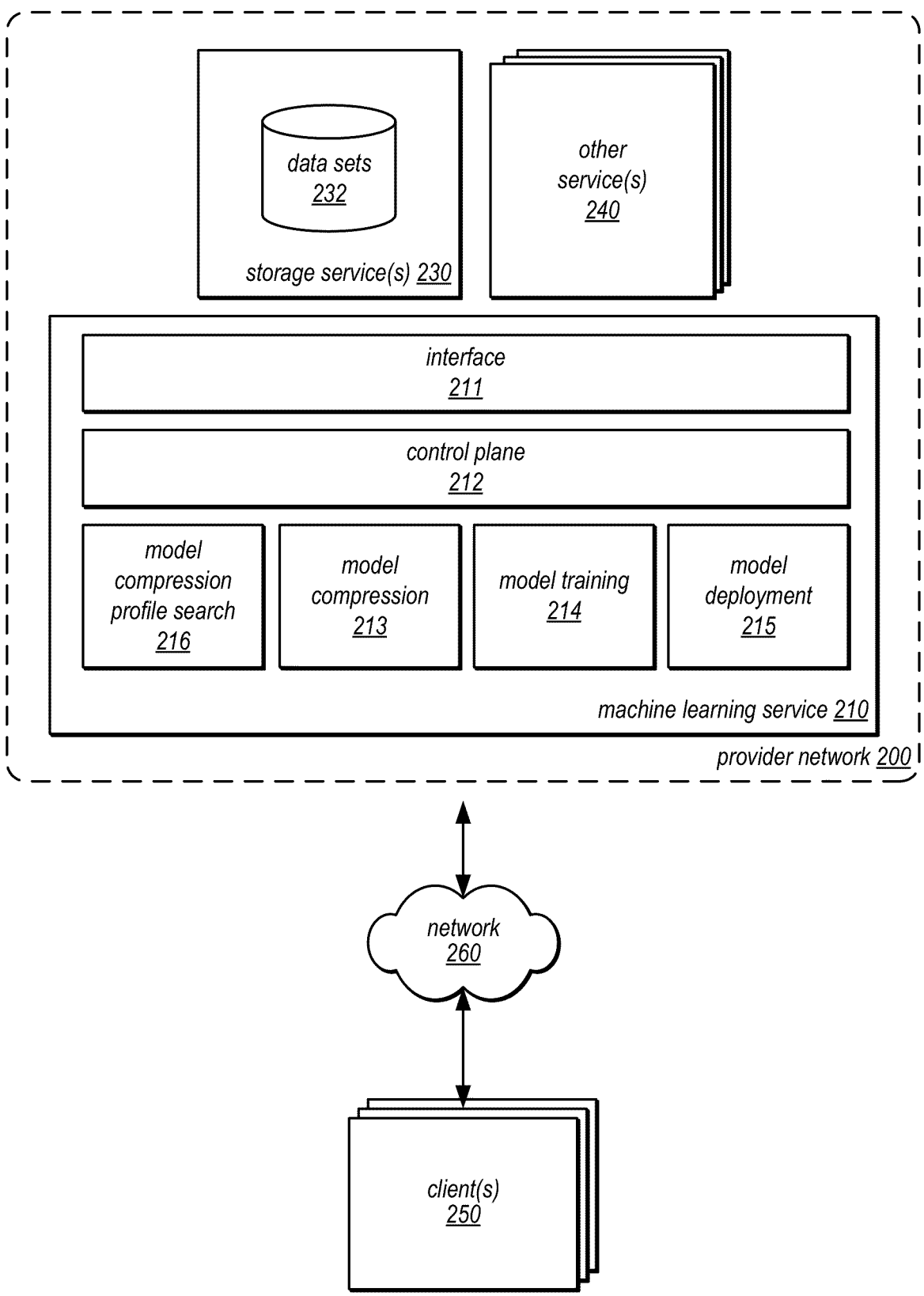
FIG. 2 illustrates an example provider network that may implement a machine learning service that performs searching compression profiles for trained neural networks, according to some embodiments.

FIG. 2 illustrates an example provider network that may implement a machine learning service that performs searching compression profiles for trained neural networks, according to some embodiments. Provider network 200 may be a private or closed system or may be set up by an entity such as a company or a public sector organization to provide one or more services (such as various types of cloud-based storage) accessible via the Internet and/or other networks to clients 250, in one embodiment. Provider network 200 may be implemented in a single location or may include numerous data centers hosting various resource pools, such as collections of physical and/or virtualized computer servers, storage devices, networking equipment and the like (e.g., computing system 1000 described below with regard to FIG. 10), needed to implement and distribute the infrastructure and services offered by the provider network 200, in one embodiment. In some embodiments, provider network 200 may implement various computing resources or services, such as machine learning service 210, storage service(s) 230, and/or any other type of network-based services 240 (which may include a virtual compute service and various other types of storage, database or data processing, analysis, communication, event handling, visualization, data cataloging, data ingestion (e.g., ETL), and security services), in some embodiments.

In various embodiments, the components illustrated in FIG. 2 may be implemented directly within computer hardware, as instructions directly or indirectly executable by computer hardware (e.g., a microprocessor or computer system), or using a combination of these techniques. For example, the components of FIG. 2 may be implemented by a system that includes a number of computing nodes (or simply, nodes), each of which may be similar to the computer system embodiment illustrated in FIG. 10 and described below, in one embodiment. In various embodiments, the functionality of a given system or service component (e.g., a component of machine learning service 210 may be implemented by a particular node or may be distributed across several nodes. In some embodiments, a given node may implement the functionality of more than one service system component (e.g., more than one data store component).

Machine learning 210 may implement interface 211 to allow clients (e.g., client(s) 250 or clients implemented internally within provider network 200, such as a client application hosted on another provider network service like an event driven code execution service or virtual compute service) to search for compression profiles or policies, compress machine learning models, train machine learning models, and deploy machine learning models (e.g., neural networks). For example, machine learning service 210 may implement interface 211 (e.g., a graphical user interface, as discussed below with regard to FIG. 4, programmatic interface that implements Application Program Interfaces (APIs) and/or a command line interface), which may be implemented so that a client can request a compression profile search to be performed on a machine learning model stored in storage service(s) 230, and/or in other storage locations within provider network 200 or external to provider network 200 (e.g., on premise data storage in private networks). Interface 211 may allow a client to request the performance of training, deployment, or other machine learning service features, in various embodiments.

Machine learning service 210 may implement a control plane 212 to perform various control operations to implement the features of machine learning service 210. For example, control plane may monitor the health and performance of requests at different components, such as model compression 213, model training 214, model deployment 215 and model compression profile search 216. If a node fails, a request fails, or other interruption occurs, control plane 212 may be able to restart a job to complete a request (e.g., instead of sending a failure response to the client). Control plane 212 may, in some embodiments, may arbitrate, balance, select, or dispatch requests to different node(s), in various embodiments. For example, control plane 212 may receive requests interface 211 which may be a programmatic interface, and identify an available node to begin work on the request.

Machine learning service 210 may implement model compression 213 to compress machine learning models according to compression profiles, in various embodiments. Machine learning service 210 may implement model training 214 to execute training techniques on various machine learning models using data sets, such as data sets 232 in storage services 230. In various embodiments, machine learning service 210 may implement model deployment 215, which may deploy a trained machine learning model on resources (e.g., virtual compute instances) to receive and return inferences or other results according to requests or other inputs to the deployed model. As discussed in detail below with regard to FIGS. 3 and 4, machine learning service 210 may implement model compression profile search 216 to identify compression profile(s) and/or compression policies for trained machine learning models that can be applied to other machine learning models with a same or similar architecture for compression.

Data storage service(s) 230 may implement different types of data stores for storing, accessing, and managing data on behalf of clients 250 as a network-based service that enables clients 250 to operate a data storage system in a cloud or network computing environment. Data storage service(s) 230 may also include various kinds relational or non-relational databases, in some embodiments, Data storage service(s) 230 may include object or file data stores for putting, updating, and getting data objects or files, in some embodiments. For example, one data storage service 230 may be an object-based data store that allows for different data objects of different formats or types of data, such as structured data (e.g., database data stored in different database schemas), unstructured data (e.g., different types of documents or media content), or semi-structured data (e.g., different log files, human-readable data in different formats like JavaScript Object Notation (JSON) or Extensible Markup Language (XML)) to be stored and managed according to a key value or other unique identifier that identifies the object. In at least some embodiments, data storage service(s) 230 may be treated as a data lake. For example, an organization may generate many different kinds of data, stored in one or multiple collections of data objects in a data storage service 230. The data objects in the collection may include related or homogenous data objects, such as database partitions of sales data, as well as unrelated or heterogeneous data objects, such as image data files (e.g., digital photos or video files) audio files and web site log files. Data storage service(s) 230 may be accessed via programmatic interfaces (e.g., APIs) or graphical user interfaces.

Generally speaking, clients 250 may encompass any type of client that can submit network-based requests to provider network 200 via network 260, including requests for object recognition service 210 (e.g., a request to search or identify an object using an object recognition index, etc.). For example, a given client 250 may include a suitable version of a web browser, or may include a plug-in module or other type of code module that can execute as an extension to or within an execution environment provided by a web browser. Alternatively, a client 250 may encompass an application such as a database application (or user interface thereof), a media application, an office application or any other application that may make use of machine learning service 210 to implement various applications. In some embodiments, such an application may include sufficient protocol support (e.g., for a suitable version of Hypertext Transfer Protocol (HTTP)) for generating and processing network-based services requests without necessarily implementing full browser support for all types of network-based data. That is, client 250 may be an application that can interact directly with provider network 200. In some embodiments, client 250 may generate network-based services requests according to a Representational State Transfer (REST)-style network-based services architecture, a document- or message-based network-based services architecture, or another suitable network-based services architecture.

In some embodiments, a client 250 may provide access to provider network 200 to other applications in a manner that is transparent to those applications. Clients 250 may convey network-based services requests (e.g., access requests to read or write data may be via network 260, in one embodiment. In various embodiments, network 260 may encompass any suitable combination of networking hardware and protocols necessary to establish network-based-based communications between clients 250 and provider network 200. For example, network 260 may generally encompass the various telecommunications networks and service providers that collectively implement the Internet. Network 260 may also include private networks such as local area networks (LANs) or wide area networks (WANs) as well as public or private wireless networks, in one embodiment. For example, both a given client 250 and provider network 200 may be respectively provisioned within enterprises having their own internal networks. In such an embodiment, network 260 may include the hardware (e.g., modems, routers, switches, load balancers, proxy servers, etc.) and software (e.g., protocol stacks, accounting software, firewall/security software, etc.) necessary to establish a networking link between given client 250 and the Internet as well as between the Internet and provider network 200. It is noted that in some embodiments, clients 250 may communicate with provider network 200 using a private network rather than the public Internet.

Figure 3:
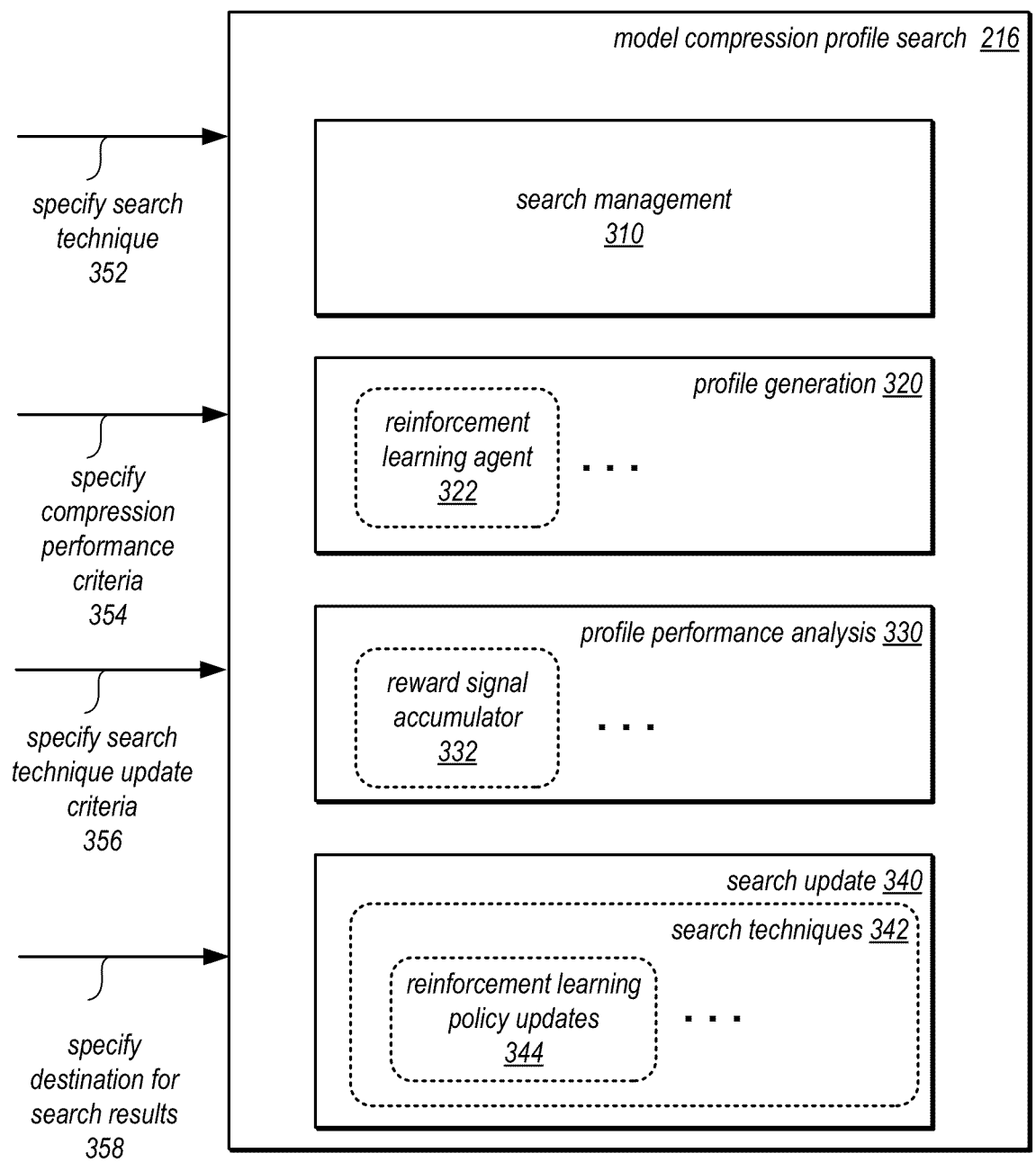
FIG. 3 illustrates a logical block diagram illustrating model compression profile search that performs searches for compression profiles for trained neural networks, according to some embodiments.

To manage the various tasks for performing compression profile search requests, machine learning service 210 may implement model compression profile search 216. FIG. 3 illustrates a logical block diagram illustrating model compression profile search that performs searches for compression profiles for trained neural networks, according to some embodiments. Model compression profile search 216 may implement search management 310, in various embodiments. Search management 310 may track the state, direct or manage workflows for handling a compression profile search request, as discussed in detail with regard to FIG. 4 below. For instance, search management 310 may maintain request state, tracking the performance of various stages of a request, including profile generation, number of iterations, updates to a compression policy being used to search, the status of the request with respect to search criteria (e.g., time elapsed, resources consumed, request costs, etc.). Search management 310 may accept, parse, and configure workflows, jobs, or other operations to perform a search requests. In some embodiments, a search request can specify various features of the search to be performed, in some embodiments, the features can be specified separately via other requests (or modified via other requests).

For example, a search technique can be specified, as indicated at 352. Model compression profile search 216 may implement or support various techniques for determining compression profiles and a compression profile. For example, random search techniques, Bayesian optimization, reinforcement learning (as discussed below with regard to FIGS. 6 - 8), among others. Search management 310 may configured or notify other features of model compression profile search 216 (e.g., profile generation 320 with reinforcement learning performed by reinforcement learning agent 322).

In some embodiments, as indicated at 354, compression performance criteria can be specified, in some embodiments. For example, compression performance criteria can (e.g., as discussed above with regard to FIG. 1 and below with regard to FIGS. 5 and 9) can be used to tailor the compression policy and thus compression profiles generated to compress a machine learning model to optimize one or multiple features of the model's performance, such as by specifying thresholds, ranges, amounts, or other performance characteristics that can be evaluated and/or satisfied (or optimized) in order to determine how to update a policy using a search technique. For example, in a reinforcement learning technique, a reward signal accumulator 332, may be specified at 354.

In some embodiments, as indicated at 356, a search technique update criteria may be specified, in some embodiments. For example, how the search is performed or adjusted may be specified (e.g., by implementing the aggressiveness of modifications, such as by increasing pruning by X factor). For different search techniques, like reinforcement learning, these updates may be policy updates 344, which may indicate how a reinforcement agent makes changes to a compression policy being trained, in some embodiments.

In some embodiments, as indicated at 358, a destination or other result configuration information may be specified. For example, a requesting system or application may direct the result to be transmitted to another system or application, which may use the compression profile or policy.

Figure 4:
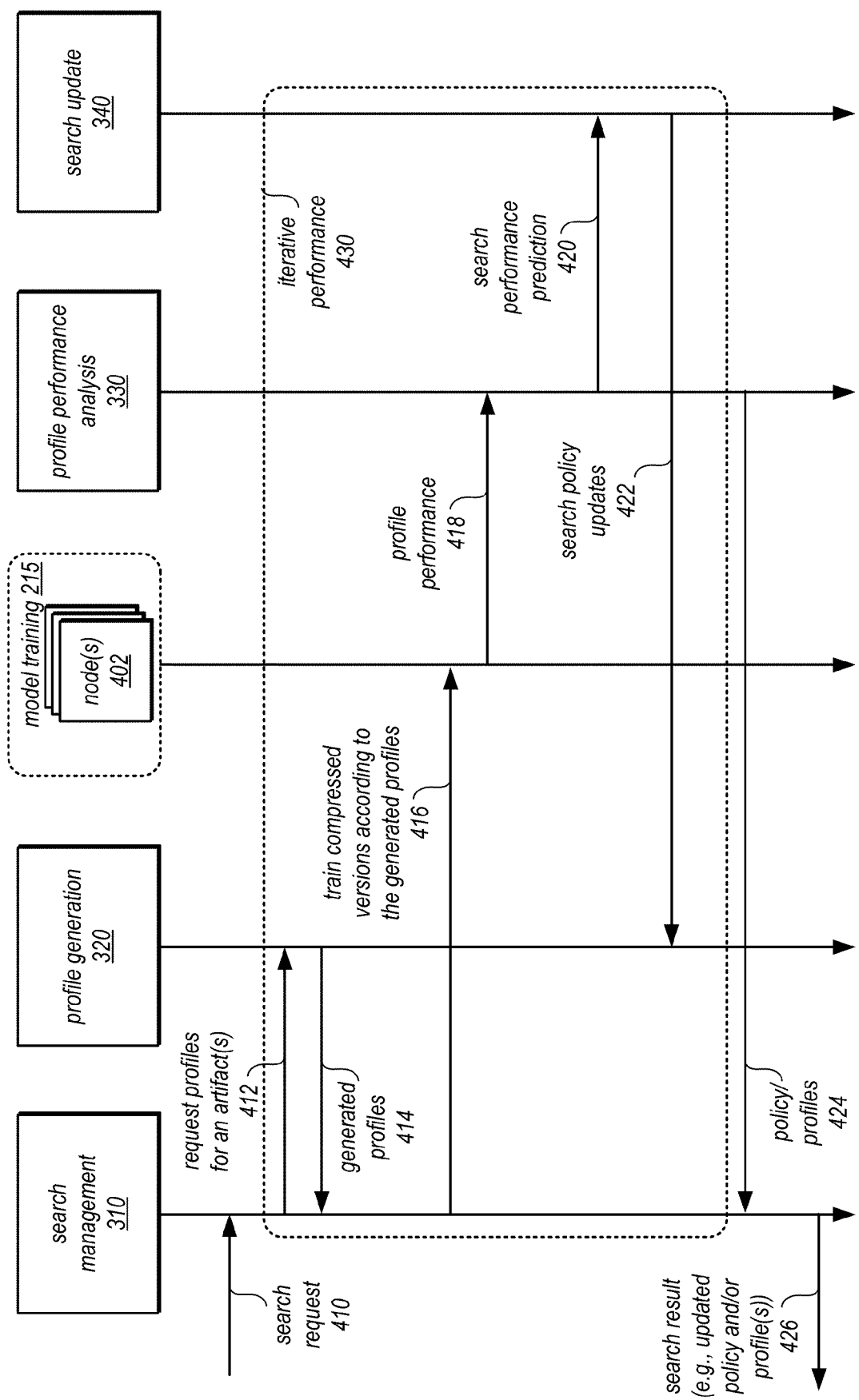
FIG. 4 illustrates a logical block diagram illustrating interactions to perform a compression profile search request, according to some embodiments.

FIG. 4 illustrates a logical block diagram illustrating interactions to perform a compression profile search request, according to some embodiments. As indicated at 410, a search request 410 may received at search management 310. Search management 310 may then dispatch a request 412 to profile generation 320 to generate profiles for artifacts, as discussed above with regard to FIG. 1. Profile generation 320 may generate the profiles according to a compression policy and search technique (e.g., reinforcement learning, Bayesian optimization, random search, etc.) and provide the generated profiles 414 to search management 310.

Search management 310 may then send one or more requests for model training 215 to compress and/or use compressed versions according to the generated profiles 416, in some embodiments. Model training 215 may implement one or more respective nodes 402 to perform compression and/or training using a data set received or identified for the artifacts of search request 410. For example, various training algorithms, execution platforms, or other machine learning environments may be deployed on node(s) 402 (which may be nodes implemented as part of machine learning service 210) which can perform training on the compressed versions of the artifacts.

Profile performance analysis 330 may collect or otherwise track profile performance of the compressed versions based on performance information 418 obtained from model training 215. Profile performance analysis 330 may perform various comparisons and other analyses, such as a prediction of compression performance, in some embodiments. Search update 340 may receive a search performance prediction 420 determined from the evaluation, as discussed below with regard to FIG. 9, and may then consider whether to or what updates should be made to the compression policy. In some embodiments, these updates may be determined according to update criteria. In some embodiments, these updates may be determined based on the type of search technique deployed (e.g., random search). For determined policy updates, the updates 422 may be provided to profile generation 320 in order to update the compression policy for generating new compression profiles.

As indicated at 430, the performance of the search request 410 may be iterative until a search criteria is satisfied. As indicated at 424, compression policies and profiles may be provided to search management (determined from the iterative performance 430) to provide as part of search result 426.

Although FIGS. 2 - 4 have been described and illustrated in the context of a provider network implementing a machine learning service, the various components illustrated and described in FIGS. 2-4 may be easily applied to other compression systems and/or machine learning systems that compress neural networks. As such, FIGS. 2 - 4 are not intended to be limiting as to other embodiments of applying compression profiles across similar neural network architectures.

Figure 5:
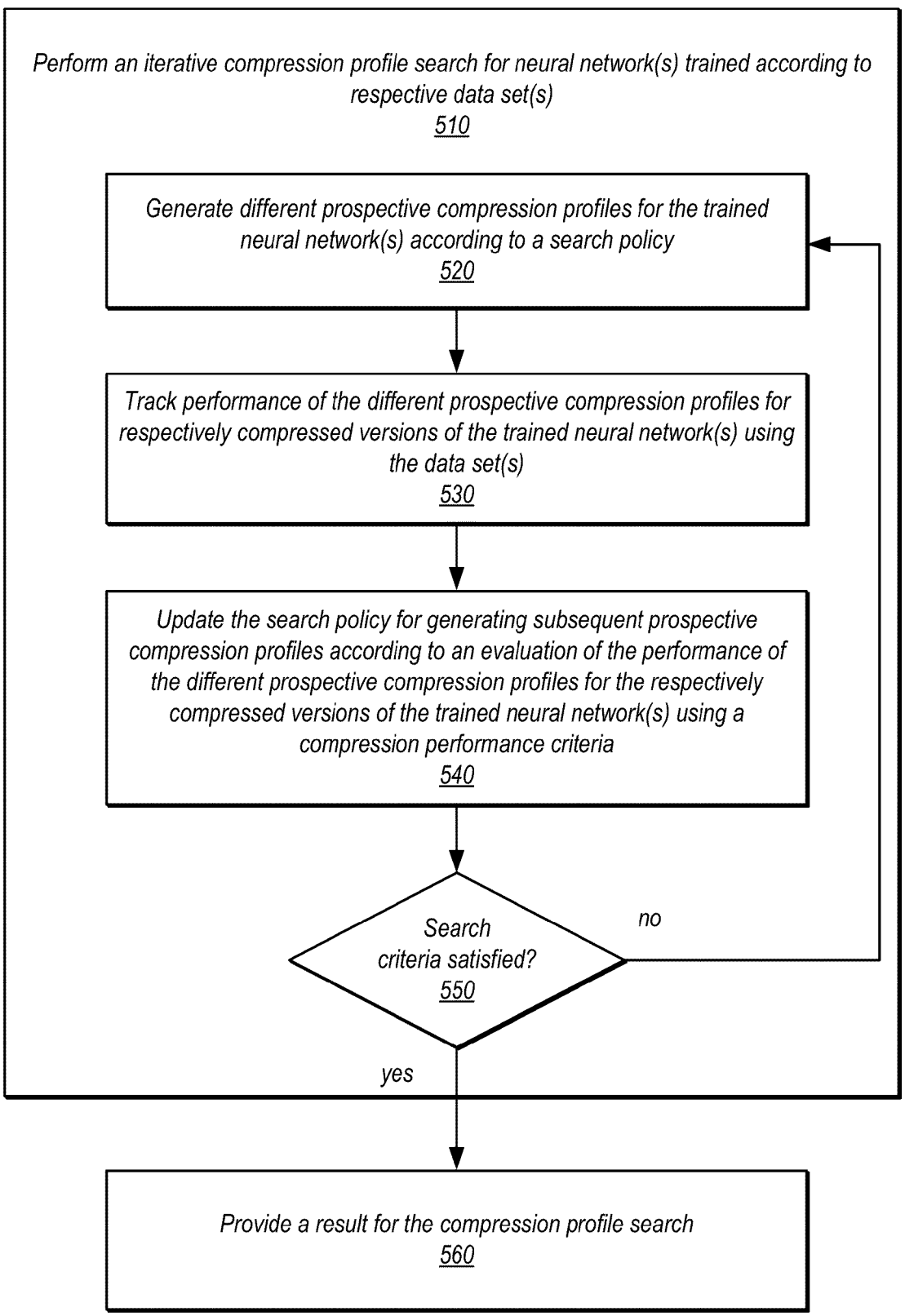
FIG. 5 illustrates a high-level flowchart of various methods and techniques to implement searching compression profiles for trained neural networks, according to some embodiments.

FIG. 5 illustrates a high-level flowchart of various methods and techniques to implement searching compression profiles for trained neural networks, according to some embodiments. Various different systems and devices may implement the various methods and techniques described below, either singly or working together. Therefore, the above examples and or any other systems or devices referenced as performing the illustrated method, are not intended to be limiting as to other different components, modules, systems, or devices.

As indicated at 510, iterative compression profile search may be performed for one or more neural networks trained according to one or more respective data sets, in some embodiments. A request may be received (e.g., from a client via an interface) to initiate the request. In some embodiments, the search may be triggered as part of a compression application, machine learning system that seeks to deploy a trained model (and wants to optimally compress a neural network).

As indicated at 520, different prospective compression profiles may be generated for the trained neural networks according to a search policy, in some embodiments. For example, as discussed above with regard to FIG. 1, a policy may specify different features of a compression profile. Aspects of a compression policy may be modified or otherwise between different prospective compression profiles in order to generate a varied set of compression profiles that are not the same. A search technique, as discussed above, may be used to determine how to vary the compression profiles (e.g., random variation, Bayes optimization, reinforcement learning, as discussed below), in some embodiments.

Compressed versions of the neural network(s) may be created using the different compression profiles, in some embodiments. For example, an encoder or other compression system may take, as input a compression profile and a trained neural network, and produced a compressed version by removing the features specified by the compression profile. Different versions of each neural network corresponding to the different compression profiles may be created, in some embodiments. As indicated at 530, performance of the different versions of the trained neural networks corresponding to the prospective compression profiles using the data sets may be tracked, in some embodiments. For example, compressed versions of the networks may be trained or invoked using the data sets, which may be specified in a search request. The utilization of various computing resources, as well as characteristics of the compressed network performance overall, such as time to complete an inference or training session, may be recorded.

As indicated at 540, the search policy for generating subsequent prospective compression profiles according to an evaluation of the performance of the different prospective compression profiles for the respectively compressed versions of the trained neural network(s) using a compression performance criteria may be updated, in some embodiments. For example, if memory consumption from compression profiles with one characteristic is better than memory consumption of another value for that characteristic is identified (when memory consumption is a compression performance criteria), then the characteristics of the more optimal memory consumption profiles may be used to update the compression policy used to search for subsequent compression profiles.

As indicated at 550, searching may continue until a search criteria is satisfied. In this way, the compression policy that is used to search for compression profiles is refined. Search criteria may be unrelated to compression performance, in some embodiments (e.g., based on time or resource limitations for performing a search). In other embodiments, search criteria may include compression performance (e.g., when compression performance is within some resource consumption threshold, then the search criteria is satisfied). As noted above, search criteria may be specified by a client request (e.g., as part of the search request) in some embodiments.

Once satisfied, then as indicated at 560, a result can be provided, in some embodiments. The result may include the latest updated compression policy and/or compression profile(s) generated by the latest compression policy, in some embodiments.

Figure 6:
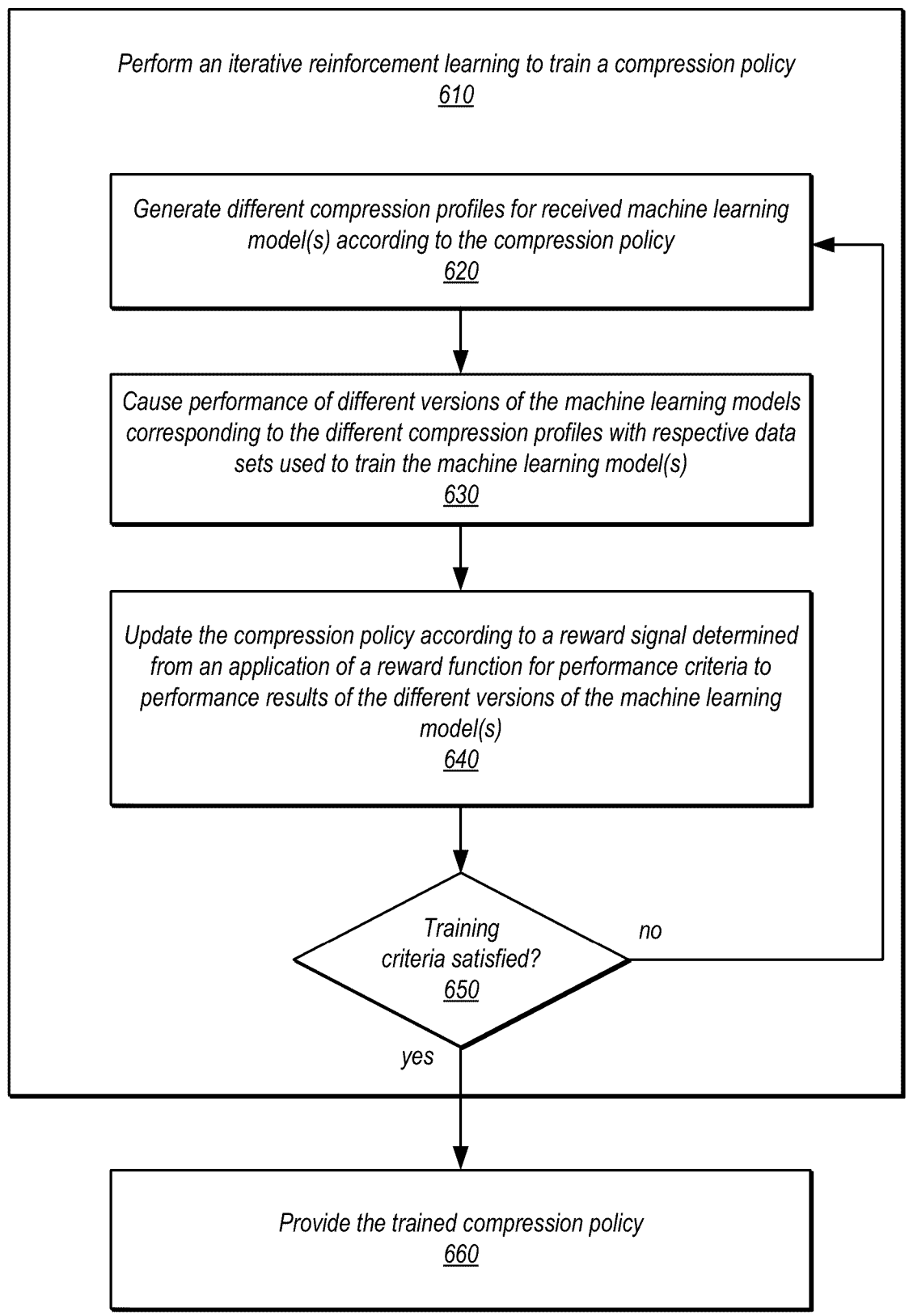
FIG. 6 illustrates a high-level flowchart of various methods and techniques to implement training a compression policy to produce compression profiles for machine learning models with reinforcement learning, according to some embodiments.

Reinforcement learning is a type of search technique that can provide a compression policy and compression profiles given trained machine learning model(s) and data set(s), in various embodiments. FIG. 6 illustrates a high-level flowchart of various methods and techniques to implement training a compression policy to produce compression profiles for machine learning models with reinforcement learning, according to some embodiments. As indicated at 610, iterative reinforcement learning to train a compression policy may be performed for machine learning model(s) (e.g., neural networks) trained according to one or more respective data sets, in some embodiments. As with FIG. 5 above, a request may be received (e.g., from a client via an interface) to initiate the request. In some embodiments, the search may be triggered as part of a compression application, machine learning system that seeks to deploy a trained model (and wants to optimally compress a neural network).

As indicated at 620, different prospective compression profiles may be generated for the trained machine learning models according to the compression policy, in some embodiments. For example, as discussed above with regard to FIG. 1, a policy may specify different features of a compression profile. A reinforcement agent process may interpret the compression policy to generate different compression profiles as part of the action space for the agent. For instance, different aspects of the compression policy may be interpreted or applied differently in order to generate a varied set of compression profiles that are not the same.

Compressed versions of the machine learning model(s) may be created using the different compression profiles, in some embodiments, similar to the discussion above with regard to FIG. 5. For example, an encoder or other compression system may take, as input a compression profile and a trained neural network, and produced a compressed version by removing the features specified by the compression profile. Different versions of each trained machine learning model corresponding to the different compression profiles may be created, in some embodiments. As indicated at 630, performance of the different versions of the machine learning models corresponding to the prospective compression profiles using the data sets may be caused, in some embodiments. For example, requests to training or execution platforms that specify the different versions and data sets may be sent.

As indicated at 640, the compression policy may be updated by the reinforcement agent process according to a reward signal determined from an application of a reward function for performance criteria to performance results of the different versions of the machine learning models, in some embodiments. For instance, as discussed in detail below, the reward function may provide an incentive to the reinforcement agent process to make updates that improve one or more performance criteria for compression profiles when generated from the updated compression policy.

As indicated at 650, training may continue until a training criteria is satisfied. In this way, the compression policy that is trained is refined until a specified scenario or condition by the training criteria. Training criteria, like search criteria, may be unrelated to compression performance, in some embodiments (e.g., based on time or resource limitations for performing a search). In other embodiments, training criteria may include compression performance (e.g., when compression performance is within some resource consumption threshold, then the search criteria is satisfied). As noted above, training criteria may be specified by a client request (e.g., as part of the search request) in some embodiments.

Once satisfied, then as indicated at 660, the trained compression profile can be provided, in some embodiments. The result may also include compression profile(s) generated by the trained compression policy, in some embodiments.

In various embodiments, reinforcement learning may develop policies, such as compression policies discussed above with regard to FIG. 6, for sequential decision making problems. A reinforcement learning agent process may make decisions based on an observation received, and try to maximize a reward signal by trial and error. In various embodiments, reinforcement training may be performed to operate on multiple trained machine learning models (e.g., artifacts) as well as multiple data sets to train a compression policy that can be applied across similar machine learning model architectures (e.g., even though various aspects of the machine learning models may still differ, such as different weight values in a neural networks).

In some embodiments, compression may be considered to be a channel pruning technique applied to trained neural networks. To apply reinforcement learning as discussed above with regard to FIG. 6, considerations of channel pruning may be represented as a Markov Decision Process. For example, the channel pruning technique may be described as a reinforcement learning agent process interacting with observations. The reinforcement agent may generate pruning decisions for each layer after observing state of the channels. Each pruning episode may reach its end after the pruning action is produced for the last layer and a reward is observed. The reinforcement learning agent searches the same space as before, but with an expected compression facto to target the search around, while simultaneously maximizing accuracy and while generalizing to multiple data sets simultaneously, in some embodiments.

In various embodiments, an action space for reinforcement learning techniques may be considered to be where the action $\alpha_i \in [0,1]$ for the $i^{th}$ step may be the value of "how much to prune for layer $L_i$. In various embodiments, the reinforcement agent process may produce compression profiles (e.g., pruning profiles produced layer-wise). For each channel in a layer, a Bernoulli with probability $p_i = \alpha_i$ may be sampled to determine if a channel is to be pruned or not. For instance, the decoding may be described $\{\alpha_i^1...\alpha_i^{c_i}\}\alpha_i^j \in \mathbb{B}, \forall j$ as the decoded action, where $\alpha_i^j \leftarrow Bern(\alpha_i)$.

In various embodiments, an observation space may described using a metric that may be similar to a channel importance metric. For layer $L_i$ with $c_i$ channels, and a pruning decoding from the action $\alpha_i \in [0,1]$ the observations corresponding to the channel j are, $$\Phi\left(L_i^j | \alpha\right) = \begin{cases} \mathbb{E}_{k_h, k_w, c_{i-1}} \left|\frac{\delta \varepsilon}{\delta L_i^j}\right| L_i^i & \text{if } \alpha_i^j = 1 \\ 0 & \text{otherwise} \end{cases}$$

where, $\varepsilon$ is the validation error of the entire network. The observation of the entire step is $(L_i) = \{\Phi(L_i^1...\Phi(L_i^{c_j}), D_i\}$, where $D_i$ is a set of layer descriptions. These features may be derived from a direct consequence of a change in the loss with respect to the actions that were just taken. These observations may be the gradients of the remaining unpruned channels in LL scaled by the value of the activations averaged across the other dimensions and average activations of the channel and across the training data set.

In various embodiments, an independent compression reward and accuracy reward may be defined and then combined into one conjoined reward term. The reward for the step i of an l-step (number of layers in the network being l) episode may be, $$r_i = \begin{cases} 0 & \text{if } i \neq l \\ \dfrac{A}{A_e} e^{-\dfrac{(C-C_e)^2}{2\sigma^2}} & \text{otherwise} \end{cases}$$

where $C_e$ may be an expected compression factor that is set at the environment-level, which may be the compression at which it may be expected to find good profiles, $A_e$ may be the expected accuracy desired, which may also be the accuracy of the original unpruned model, A may be the accuracy that is produced by the model at the end of the episode, C may be the compression factor at the end of the episode and σ may be some variance.

Figure 7A:
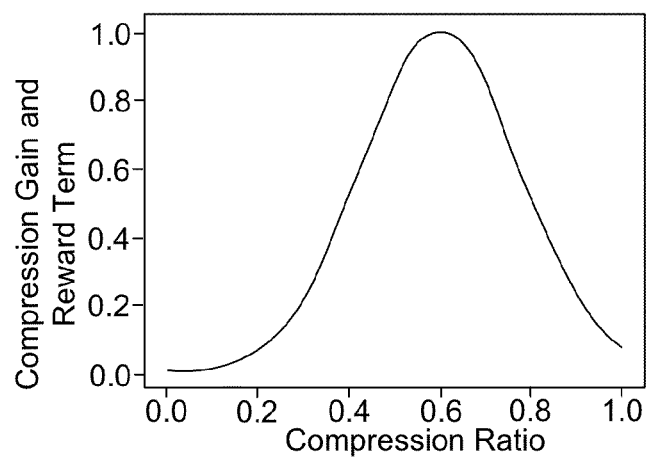
FIGS. 7A-7C illustrate charts of various features of an example reward landscape, according to some embodiments.
Figure 7B:
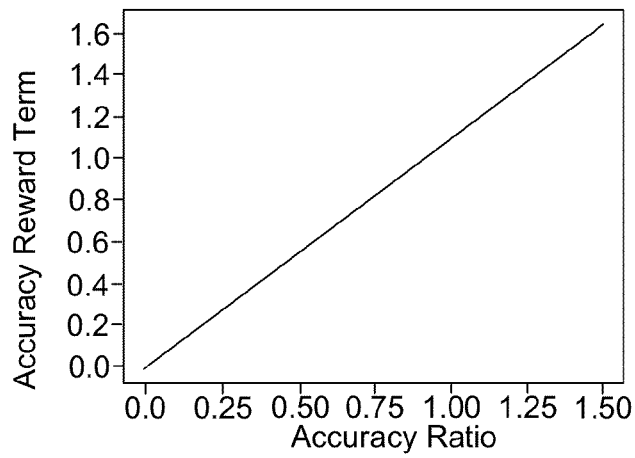
Figure 7C:
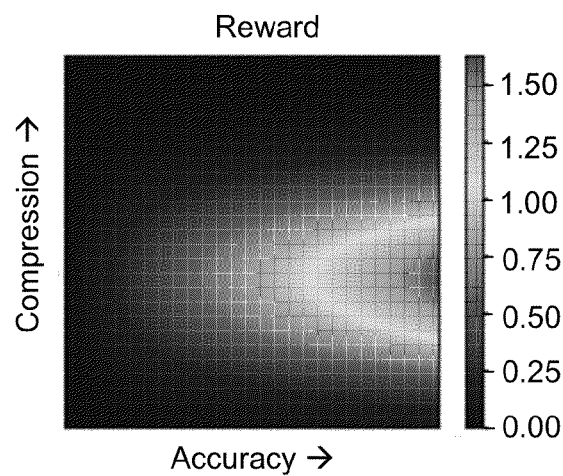

FIGS. 7A - 7C illustrate charts of various features of an example reward landscape, according to some embodiments. FIG. 7A may illustrate an example comparison of a compression ratio compared with the compression gain reward term. FIG. 7B may illustrate an example comparison of an accuracy ratio compared with the accuracy reward term. FIG. 7C may illustrate comparisons of the joined reward terms for compression and accuracy. As depicted in these figures, rewards may encourage agents to maintain as high an accuracy as possible while requiring the compression factor to remain around the expected compression factor, in some embodiments. While using this reward landscape, it may be noticed that some reinforcement learning agent processes may learn to fixate around the expected compression factor, in order to maximize the accuracy. It may also be noticed that the accuracy reward can be greater than 1 as well, in some embodiments, for cases where the pruned model can outperform the unpruned model, as compression can sometimes regularize models to generalize well.

Figure 8:
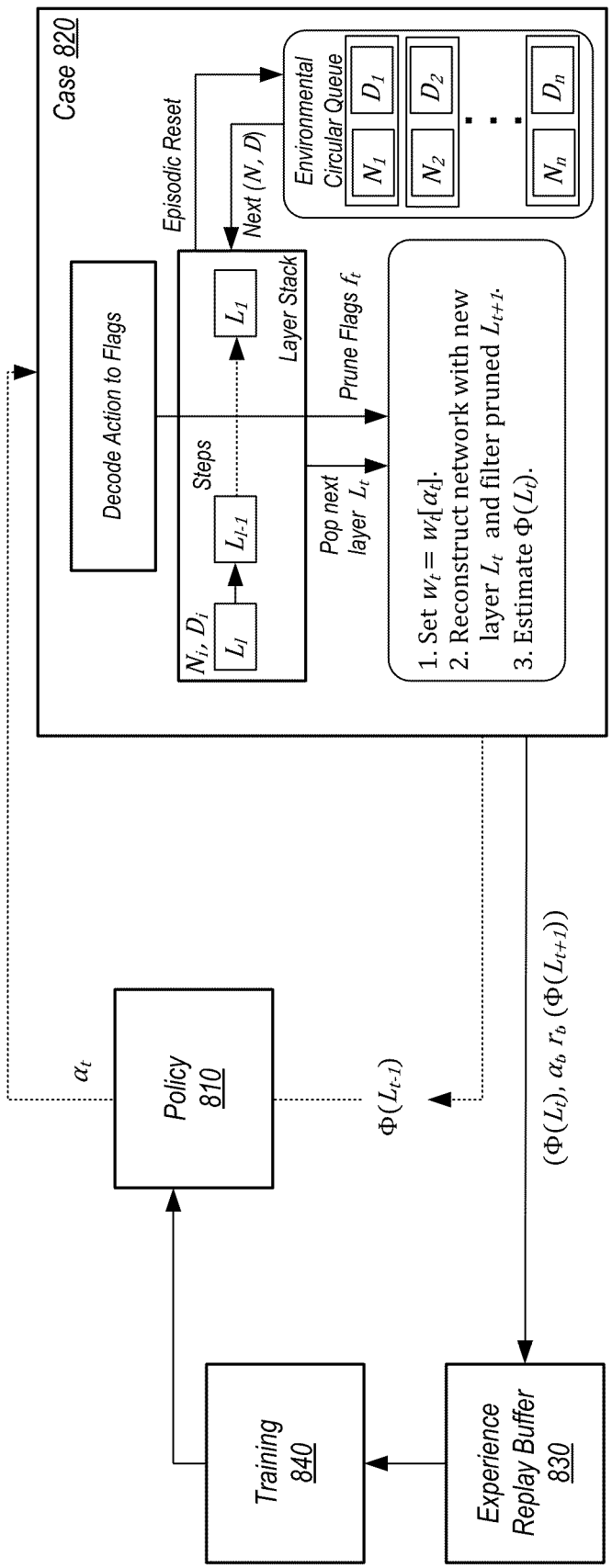
FIG. 8 illustrates a logical block diagram of reinforcement training for training a compression policy to prune trained neural networks, according to some embodiments.

To train a compression policy, a circular queue of Markov Decision Processes may be implemented, in some embodiments, containing pairs of networks and a data set with which the network was trained ($N_i$, $D_i$). At the beginning of a new episode (episodic reset) a new (N, D) pair may be chosen. FIG. 8 illustrates a logical block diagram of reinforcement training for training a compression policy to prune trained neural networks, according to some embodiments. In FIG. 8, an episode may begin at layer $L_1$ and end at layer $L_l$, for an l-layer network. At any time step t, $1 \leq t \leq l$, in this episode, layer $L_t$ may be modified as per the actions provided by the agents and the state may be updated with the observation of that layer $\Phi(L_t)$. The objective may be to maximize the rewards over several cycles of the circular queue, in some embodiments. Therefore, the reinforcement learning agent process may have run through all the network-dataset pairs in the queue and will have to maximize all of them in general. A Proximal Policy Optimization (PPO) algorithm may be performed to train the policy, in some embodiments.

For instance, case 820 of FIG. 8, illustrates the actions taken to prune layers. As indicated in FIG. 8, the experience of pruning actions in case 820 may be stored in experience replay buffer 830. Storing compression profiles in such a manner may allow for experience replay buffer 830 to be considered as part of training 840 when making updates to policy 810, in some embodiments.

Figure 9:
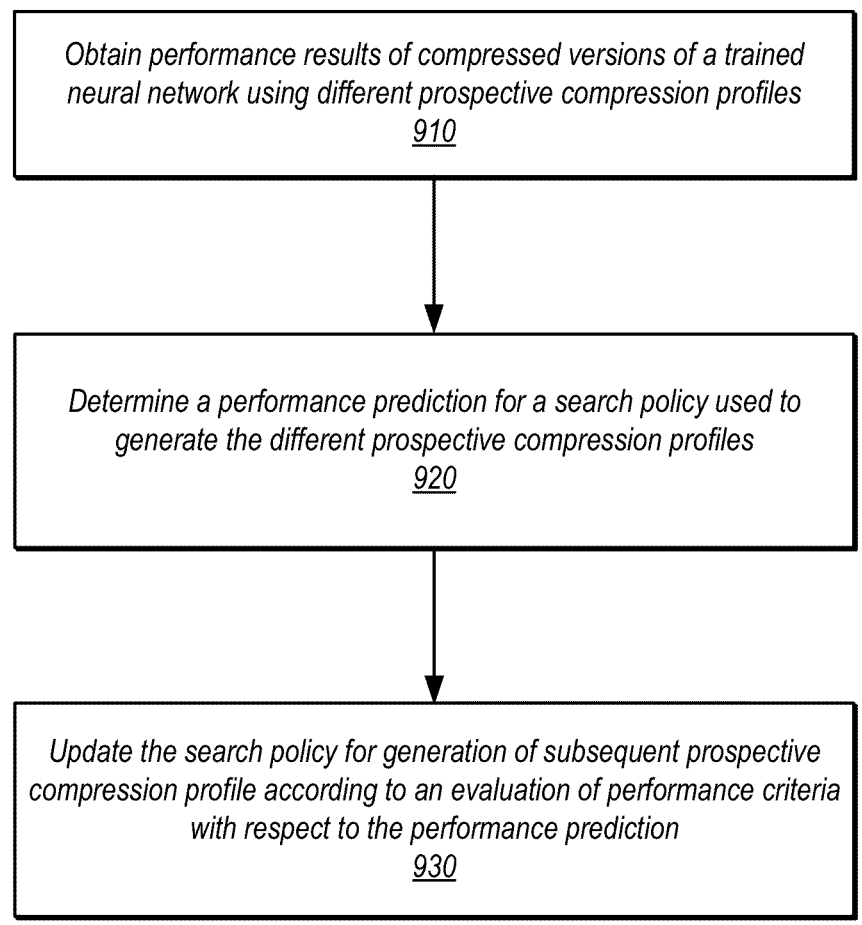
FIG. 9 illustrates a high-level flowchart of various methods and techniques to implement determining performance predictions for updating a compression policy for a compression profile search, according to some embodiments.

In some embodiments, adjustments to a compression policy being used to search for compression profiles and an updated compression policy may be made based on predictions of the performance of that search policy. FIG. 9 illustrates a high-level flowchart of various methods and techniques to implement determining performance predictions for updating a compression policy for a compression profile search, according to some embodiments. As indicated at 910, performance results of compressed versions of a trained neural network using different prospective compression profiles may be obtained, in some embodiments. As discussed above, compressed versions of trained neural networks may be generated and then implemented in order to test the performance of the differences between the generated compression profiles.

As indicated at 920, a performance prediction for a search policy used to generate the different prospective compression profiles may be determined, in some embodiments. For example, pattern or feature recognition may be applied to the performance results of the different compression profiles to determine a common performance for the search policy (e.g., the search policy lowered or increased processor utilization X percent). As indicated at 930, the search policy may be updated for generation of subsequent prospective compression profile according to an evaluation of performance criteria with respect to the performance prediction, in some embodiments. For instance, if performance criteria species a maximum processor utilization amount, then if the predicted performance for the policy indicates that it improves upon being within the maximum processor utilization amount, then further updates may be made to the search policy to continue reducing processor utilization.

The methods described herein may in various embodiments be implemented by any combination of hardware and software. For example, in one embodiment, the methods may be implemented on or across one or more computer systems (e.g., a computer system as in FIG. 10) that includes one or more processors executing program instructions stored on one or more computer-readable storage media coupled to the processors. The program instructions may implement the functionality described herein (e.g., the functionality of various servers and other components that implement the network-based virtual computing resource provider described herein). The various methods as illustrated in the figures and described herein represent example embodiments of methods. The order of any method may be changed, and various elements may be added, reordered, combined, omitted, modified, etc.

Figure 10:
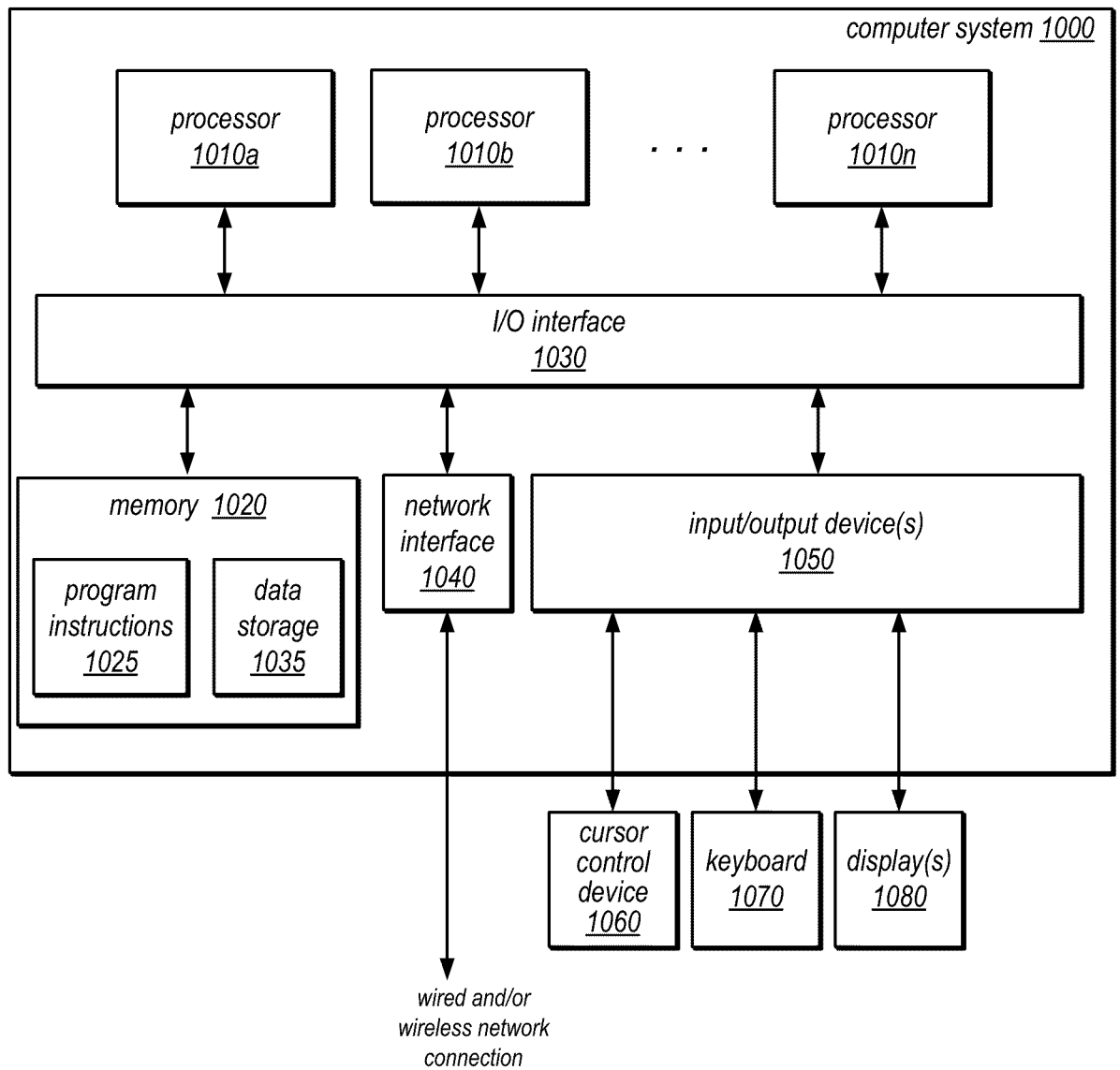
FIG. 10 illustrates an example system to implement the various methods, techniques, and systems described herein, according to some embodiments.

Embodiments of searching compression profiles for trained neural networks as described herein may be executed on one or more computer systems, which may interact with various other devices. One such computer system is illustrated by FIG. 10. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing device, computing node, compute node, or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. Display(s) 1080 may include standard computer monitor(s) and/or other display systems, technologies or devices. In at least some implementations, the input/output devices 1050 may also include a touch- or multi-touch enabled device such as a pad or tablet via which a user enters input via a stylus-type device and/or one or more digits. In some embodiments, it is contemplated that embodiments may be implemented using a single instance of computer system 1000, while in other embodiments multiple such systems, or multiple nodes making up computer system 1000, may host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions that execute on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above are shown stored within system memory 1020 as program instructions 1025 and data storage 1035, respectively. In other embodiments, program instructions and/or data may be received, sent or stored upon different types of computer-accessible media or on similar media separate from system memory 1020 or computer system 1000. Generally speaking, a non-transitory, computer-readable storage medium may include storage media or memory media such as magnetic or optical media, e.g., disk or CD/DVD-ROM coupled to computer system 1000 via I/O interface 1030. Program instructions and data stored via a computer-readable medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

As shown in FIG. 10, memory 1020 may include program instructions 1025, that implement the various methods and techniques as described herein, and data storage 1035, comprising various data accessible by program instructions 1025. In one embodiment, program instructions 1025 may include software elements of embodiments as described herein and as illustrated in the Figures. Data storage 1035 may include data that may be used in embodiments. In other embodiments, other or different software elements and data may be included.

Those skilled in the art will appreciate that computer system 1000 is merely illustrative and is not intended to limit the scope of the techniques as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a non-transitory, computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

It is noted that any of the distributed system embodiments described herein, or any of their components, may be implemented as one or more web services. In some embodiments, a network-based service may be implemented by a software and/or hardware system designed to support interoperable machine-to-machine interaction over a network. A network-based service may have an interface described in a machine-processable format, such as the Web Services Description Language (WSDL). Other systems may interact with the web service in a manner prescribed by the description of the network-based service's interface. For example, the network-based service may describe various operations that other systems may invoke, and may describe a particular application programming interface (API) to which other systems may be expected to conform when requesting the various operations.

In various embodiments, a network-based service may be requested or invoked through the use of a message that includes parameters and/or data associated with the network-based services request. Such a message may be formatted according to a particular markup language such as Extensible Markup Language (XML), and/or may be encapsulated using a protocol such as Simple Object Access Protocol (SOAP). To perform a web services request, a network-based services client may assemble a message including the request and convey the message to an addressable endpoint (e.g., a Uniform Resource Locator (URL)) corresponding to the web service, using an Internet-based application layer transfer protocol such as Hypertext Transfer Protocol (HTTP).

In some embodiments, web services may be implemented using Representational State Transfer ("RESTful") techniques rather than message-based techniques. For example, a web service implemented according to a RESTful technique may be invoked through parameters included within an HTTP method such as PUT, GET, or DELETE, rather than encapsulated within a SOAP message.

The various methods as illustrated in the FIGS. and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:
   at least one processor; and
   a memory, storing program instructions that when executed cause the at least one processor to implement a compression profile search system, the compression profile search system configured to:
      receive a request for a compression profile search for one or more neural networks trained according to one or more respective data sets;
      responsive to the request:
         until a search criteria for the compression profile is satisfied, the compression profile search system is configured to iteratively perform:
            generate a plurality of different prospective compression profiles for the one or more trained neural networks according to a search policy;
            cause performance of respective versions of the one or more trained neural networks that are compressed according to the different prospective compression profiles using the respective one or more data sets;
            determine respective performance metrics for the respective versions of the trained neural network that are compressed according to the different prospective compression profiles; and
            update the search policy for a subsequent iteration to generate prospective compression profiles according to an evaluation of the respective performance metrics for the respective versions of the trained neural network; and
         return one or more of the plurality of different prospective compression profiles generated according to the updated search policy of a last iteration of the compression profile search system in response to the request.

2. The system of claim 1, wherein the compression profile search system is further configured to return the updated search policy of a last iteration as part of the response to the request.

3. The system of claim 1, wherein the request for the compression profile search is received from a client via an interface for the compression profile generation system and wherein an initial version of the search policy is also received from the client via the interface.

4. The system of claim 1, wherein the request for the compression profile search is received from a client via an interface for the compression profile search system and wherein the compression performance criteria is also received from the client via the interface.

5. A method, comprising:
until a search criteria for a compression profile is satisfied, performing an iterative compression profile search for one or more neural networks trained according to a respective one or more data sets, wherein performing the iterative compression profile search comprises:
generating different prospective compression profiles for the one or more trained neural networks according to a search policy;
tracking performance of the different prospective compression profiles for respectively compressed versions the one or more trained neural networks using the one or more data sets;
updating the search policy for generating subsequent prospective compression profiles according to an evaluation of the performance of the different prospective compression profiles for the respectively compressed versions of the one or more trained neural networks using a compression performance criteria; and
providing a result for the compression profile search.

6. The method of claim 5, further comprising receiving a request for the compression profile search from a client via an interface for a compression profile search system and wherein the compression performance criteria is also received from the client via the interface.

7. The method of claim 5, further comprising receiving a request for the compression profile search from a client via an interface for a compression profile search system and wherein the search policy is also received from the client via the interface.

8. The method of claim 5, wherein updating the search policy for generating subsequent prospective compression profiles according to the evaluation of the performance of the different prospective compression profiles for the respectively compressed versions of the one or more trained neural networks using the compression performance criteria comprises:
determining a performance prediction for the search policy based, at least in part, on the performance of the different prospective compression profiles for the one or more trained neural networks using the one or more data sets, wherein the update is based, at least in part, on the performance prediction.

9. The method of claim 5, further comprising receiving a request for the compression profile search from a client via an interface for a compression profile search system and wherein the one or more updates performed as part of iteratively training the compression policy are determined according to one or more update criteria for the search technique that is also received from the client via the interface.

10. The method of claim 5, wherein performing the iterative compression profile search comprises further comprises directing performance of the different prospective compression profiles for the one or more trained neural networks using the respective one or more data sets with one or more shared portions of execution state.

11. The method of claim 5, wherein the result for the compression profile request includes the updated search policy of a last iteration of performing the iterative compression profile search.

12. The method of claim 5, wherein the search criteria is satisfied after exceeding a threshold amount of time for performing the search.

13. The method of claim 5, wherein the request is received from a model compression system implemented as part of a machine learning service offered by a provider network.

14. One or more non-transitory, computer-readable storage media, storing program instructions that when executed on or across one or more computing devices cause the one or more computing devices to implement:
receiving a compression profile search request for one or more neural networks trained according to one or more respective data sets;
responsive to the compression profile search request:
until a search criteria for the compression profile is satisfied, iteratively performing:
generating different prospective compression profiles for the one or more trained neural networks according to a search policy;
causing performance of the different prospective compression profiles for the one or more trained neural networks using the respective one or more data sets;
updating the search policy for generating subsequent prospective compression profiles according to an evaluation of the performance of the different prospective compression profiles for the respectively compressed versions of the one or more trained neural networks using a compression performance criteria; and
returning a result for the compression profile search in response to the request.

15. The one or more non-transitory, computer-readable storage media of claim 14, wherein the request for the compression profile is received from a client via an interface for a compression profile search system and wherein the search technique is also received from the client via the interface.

16. The one or more non-transitory, computer-readable storage media of claim 14, wherein, in the updating the search policy for generating subsequent prospective compression profiles according to the evaluation of the performance of the different prospective compression profiles for the respectively compressed versions of the one or more trained neural networks using the compression performance criteria, the program instructions cause the one or more computing devices to implement:
determining a performance prediction for the search technique based, at least in part, on the performance of the different prospective compression profiles for the one or more trained neural networks using the respective one or more data sets, wherein the update is based, at least in part, on the performance prediction.

17. The one or more non-transitory, computer-readable storage media of claim 14, wherein the compression profile search request is received from a client via an interface for a compression profile generation system and wherein the one or more updates to the search policy are determined according to an update criteria for the search policy that is also received from the client via the interface.

18. The one or more non-transitory, computer-readable storage media of claim 14, wherein causing performance of the different prospective compression profiles for the one or more trained neural networks using the respective one or more data sets shares one or more portions of execution state.

19. The one or more non-transitory, computer-readable storage media of claim 14, wherein the result for the compression profile request includes one or more of the prospective compression profiles generated of a last iteration before the search criteria was satisfied.

20. The one or more non-transitory, computer-readable storage media of claim 14, wherein the one or more trained neural networks are convolutional neural networks and wherein the prospective compression profiles generated according to the search policy identify one or more channels in different layers of the one or more convolutional neural networks to prune.

* * * * *